(12) United States Patent
Lee et al.

(10) Patent No.: US 11,367,728 B2
(45) Date of Patent: Jun. 21, 2022

(54) MEMORY STRUCTURE

(71) Applicant: Powerchip Semiconductor Manufacturing Corporation, Hsinchu (TW)

(72) Inventors: Shih-Ping Lee, Hsinchu (TW); Shyng-Yeuan Che, Hsinchu County (TW); Hsiao-Pei Lin, Miaoli County (TW); Po-Yi Wu, Hsinchu (TW); Kuo-Fang Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 86 days.

(21) Appl. No.: 17/075,708

(22) Filed: Oct. 21, 2020

(65) Prior Publication Data

US 2021/0043633 A1 Feb. 11, 2021

Related U.S. Application Data

(63) Continuation of application No. 16/357,334, filed on Mar. 19, 2019, now Pat. No. 10,868,017.

(30) Foreign Application Priority Data

Jan. 21, 2019 (TW) .................................. 108102291

(51) Int. Cl.
*H01L 27/108* (2006.01)
*H01L 49/02* (2006.01)

(52) U.S. Cl.
CPC .... *H01L 27/10829* (2013.01); *H01L 27/1087* (2013.01); *H01L 27/10867* (2013.01); (Continued)

(58) Field of Classification Search
CPC ..... H01L 2924/1434; H01L 2924/1205; H01L 2924/19042; H01L 28/00; H01L 27/1087; (Continued)

(56) References Cited

U.S. PATENT DOCUMENTS

| 6,794,254 B1 * | 9/2004 | Tzeng | H01L 27/10894 438/283 |
| 9,721,959 B2 * | 8/2017 | Takahashi | G11C 11/24 |

(Continued)

*Primary Examiner* — Galina G Yushina
(74) *Attorney, Agent, or Firm* — JCIPRNET

(57) ABSTRACT

Provided is a memory structure including first and second transistors, an isolation structure, a conductive layer, and a capacitor. The first transistor and the second transistor are disposed on a substrate. Each of the first and second transistors includes a gate disposed on the substrate and two source/drain regions disposed in the substrate. The isolation structure is disposed in the substrate between the first and the second transistors. The conductive layer is disposed above the first transistor and the second transistor, and includes a circuit portion, a first dummy portion, and a second dummy portion, wherein the circuit portion is electrically connected to the first transistor and the second transistor, the first dummy portion is located above the first transistor, and the second dummy portion is located above the second transistor. The capacitor is disposed on the substrate and located between the first dummy portion and the second dummy portion.

7 Claims, 9 Drawing Sheets

(52) U.S. Cl.
CPC .............. *H01L 28/40* (2013.01); *H01L 28/90* (2013.01); *G09G 2300/0842* (2013.01)

(58) Field of Classification Search
CPC . H01L 28/40; H01L 28/90; H01L 2924/1435; H01L 27/10829; H01L 27/10867; H01L 27/108; H01L 27/10844; H01L 27/11568; G09G 2300/0842; G11C 14/0009
See application file for complete search history.

(56) References Cited

U.S. PATENT DOCUMENTS

| | | | |
|---|---|---|---|
| 10,020,311 B1* | 7/2018 | Li | H01L 27/10885 |
| 2015/0054086 A1* | 2/2015 | Saino | H01L 21/761 |
| | | | 257/369 |

* cited by examiner

MEMORY STRUCTURE

CROSS-REFERENCE TO RELATED APPLICATION

This application is a divisional application of and claims the priority benefit of U.S. application Ser. No. 16/357,334, filed on Mar. 19, 2019, now allowed, which claims the priority benefit of Taiwan application serial no. 108102291, filed on Jan. 21, 2019. The entirety of each of the above-mentioned patent applications is hereby incorporated by reference herein and made a part of specification.

BACKGROUND

Technical Field

The present invention relates to a semiconductor structure, and more particularly to a memory structure.

Description of Related Art

A memory structure including a transistor and a capacitor has been developed. In this memory structure, the capacitor is used as a storage device. Under the current trend of increasing the integration of devices, how to effectively improve the electrical performance of the memory device without increasing the size of the memory cell is the current goal of the industry.

SUMMARY

The present invention provides a memory structure in which a capacitor is disposed between dummy portions of a conductive layer above the transistors.

The memory structure of the present invention includes a first transistor, a second transistor, an isolation structure, a conductive layer, and a capacitor. The first transistor and the second transistor are disposed on a substrate, wherein each of the first and second transistors comprises a gate disposed on the substrate and two source/drain regions disposed in the substrate. The isolation structure is disposed in the substrate between the first transistor and the second transistor. The conductive layer is disposed above the first transistor and the second transistor, and includes a circuit portion, a first dummy portion, and a second dummy portion, wherein the circuit portion is electrically connected to the first transistor and the second transistor, the first dummy portion is located above the first transistor, and the second dummy portion is located above the second transistor. The capacitor is disposed on the substrate and located between the first dummy portion and the second dummy portion.

In an embodiment of the memory structure of the present invention, the first transistor may be one of an N-type metal oxide semiconductor transistor and a P-type metal oxide semiconductor transistor, and the second transistor may be another one of the N-type metal oxide semiconductor transistor and the P-type metal oxide semiconductor transistor.

In an embodiment of the memory structure of the present invention, the capacitor may expose at least one portion of a top surface of the first dummy portion and at least one portion of a top surface of the second dummy portion.

In an embodiment of the memory structure of the present invention, the capacitor may be not in contact with the gate of the first transistor and the gate of the second transistor.

In an embodiment of the memory structure of the present invention, the memory structure may further include a liner layer disposed on a sidewall of the conductive layer.

In an embodiment of the memory structure of the present invention, the capacitor may be composed of a lower electrode, an upper electrode and an insulating layer between the lower electrode and the upper electrode.

In an embodiment of the memory structure of the present invention, the lower electrode of the capacitor may be connected to one of the source/drain regions of the first transistor, one of the source/drain regions of the second transistor and the isolation structure.

Based on the above, in the memory structure of the present invention, the capacitor is disposed between the dummy portions of the conductive layer above the transistors, so that the coupling ratio (or coupling area) between the lower electrode and the upper electrode can be increased without increasing the layout area, thereby improving the performance of the memory structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
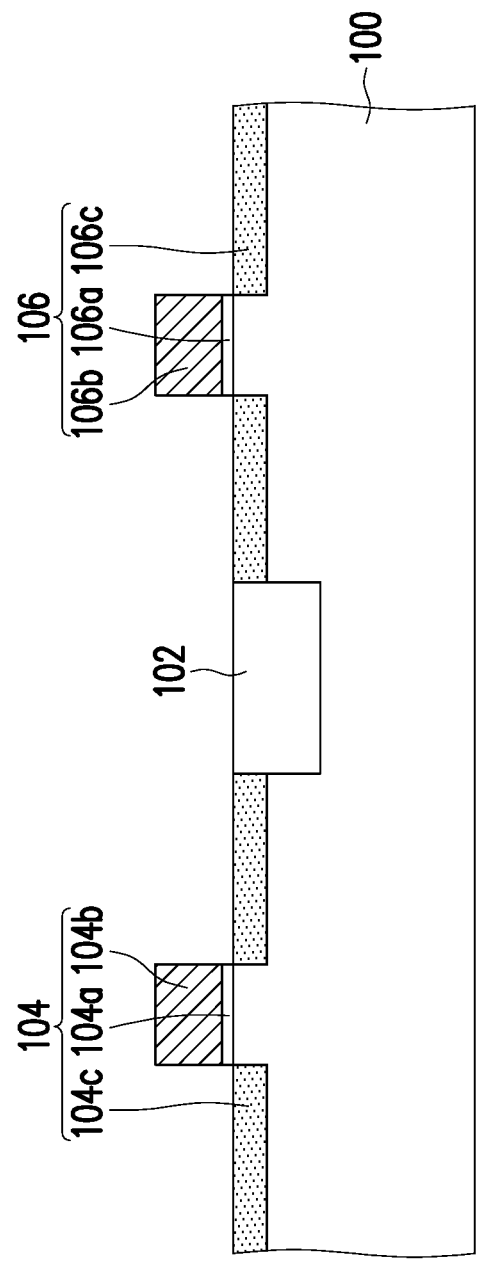
FIGS. 1A to 1D are schematic cross-sectional views showing a manufacturing process of a memory structure in accordance with an embodiment of the present invention.

The embodiments are described in detail below with reference to the accompanying drawings, but the embodiments are not intended to limit the scope of the invention. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the invention.

FIGS. 1A to 1D are schematic cross-sectional views showing a manufacturing process of a memory structure in accordance with an embodiment of the present invention.

Referring to FIG. 1A, a substitute 100 is provided. The substrate 100 is, for example, a silicon substrate. Then, an isolation structure 102 is formed in the substrate 100 to define an active area (AA). The isolation structure 102 is, for example, a shallow trench isolation (STI) structure. The method of forming the isolation structure 102 is well-known to those skilled in the art and will not be described herein. Next, a transistor 104 and a transistor 106 are formed. The transistor 104 and the transistor 106 are separated from each other by the isolation structure 102. The transistor 104 has a conductive type different from that of the transistor 106. For example, the transistor 104 is an N-type metal oxide semiconductor transistor, and the transistor 106 is a P-type metal oxide semiconductor transistor. On the contrary, the transistor 104 is a P-type metal oxide semiconductor transistor, and the transistor 106 is an N-type metal oxide semiconductor transistor. In this embodiment, the transistor 104 includes a gate dielectric layer 104a and a gate 104b sequentially disposed on the substrate 100, and two doped regions 104c as a source region and a drain region disposed in the substrate 100, and the transistor 106 includes a gate dielectric layer 106a and a gate 106b sequentially disposed on the substrate 100, and two doped regions 106c as a source region and a drain region disposed in the substrate 100. The method of forming the transistor 104 and the transistor 106 is well-known to those skilled in the art and will not be described herein.

Figure 1B:
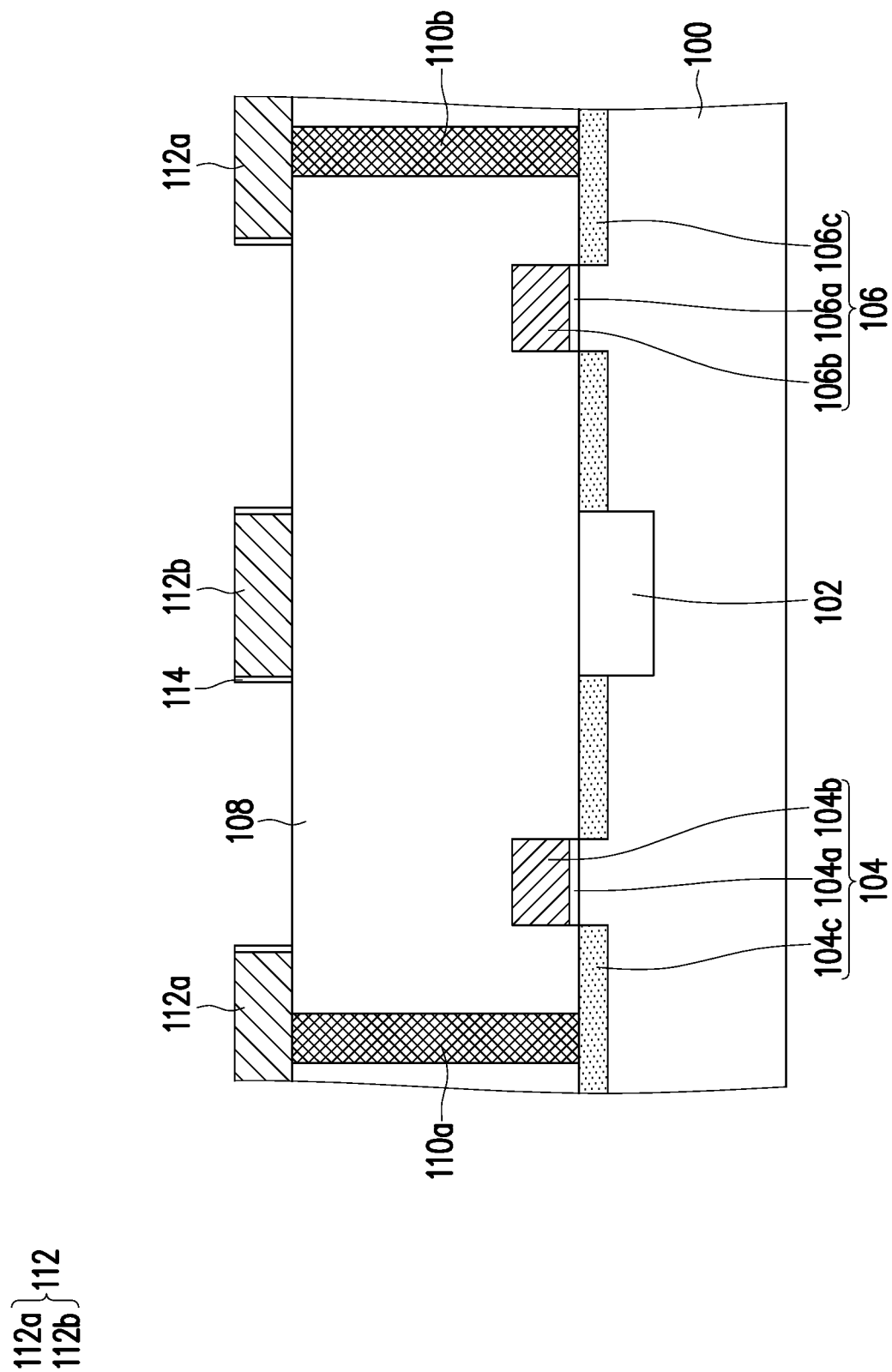

Then, referring to FIG. 1B, a dielectric layer 108 is formed on the substrate 100. The dielectric layer 108 covers the transistor 104 and the transistor 106. The dielectric layer 108 is, for example, a silicon oxide layer. The dielectric layer 108 is generally referred to as an inter-layer dielectric layer. Next, a contact 110a and a contact 110b are formed in the dielectric layer 108. The contact 110a is connected to one of the doped regions 104c of the transistor 104 penetrating through the dielectric layer 108, and the contact 110b is connected to one of the doped regions 106c of the transistor 106 penetrating through the dielectric layer 108. The method of forming the contact 110a and the contact 110b is well-known to those skilled in the art and will not be described herein. Then, a conductive material layer (not shown) is formed on the dielectric layer 108. The conductive material layer is, for example, a copper layer or an aluminum layer. Further, the conductive material layer may be a composite layer composed of a copper layer or an aluminum layer and a barrier layer disposed thereon and/or thereunder. The barrier layer described above is, for example, a titanium nitride layer, a tantalum nitride layer, a silicon nitride layer or a combination thereof. Next, the conductive material layer is patterned to form a conductive layer 112. The conductive layer 112 includes a circuit portion 112a and a dummy portion 112b. The circuit portion 112a is connected to the contact 110a and the contact 110b for electrically connecting to the transistor 104 and the transistor 106; that is, the circuit portion 112a is a portion of an interconnection structure. The dummy portion 112b is located above the isolation structure 102 and is electrically separated from the circuit portion 112a and other devices.

Next, a liner layer 114 is optionally formed on the sidewall of the conductive layer 112. The liner layer 114 is, for example, a titanium nitride layer, a titanium layer, a tantalum nitride layer, a tantalum layer, a silicon nitride layer, a silicon oxynitride layer or a silicon oxide layer. The liner layer 114 is formed by, for example, conformally forming a liner material layer on the dielectric layer 108 and then performing an anisotropic etching process to remove a portion of the liner material layer. The liner layer 114 is used to prevent the conductive layer 112 from being damaged during the subsequent etching processes.

Figure 1C:
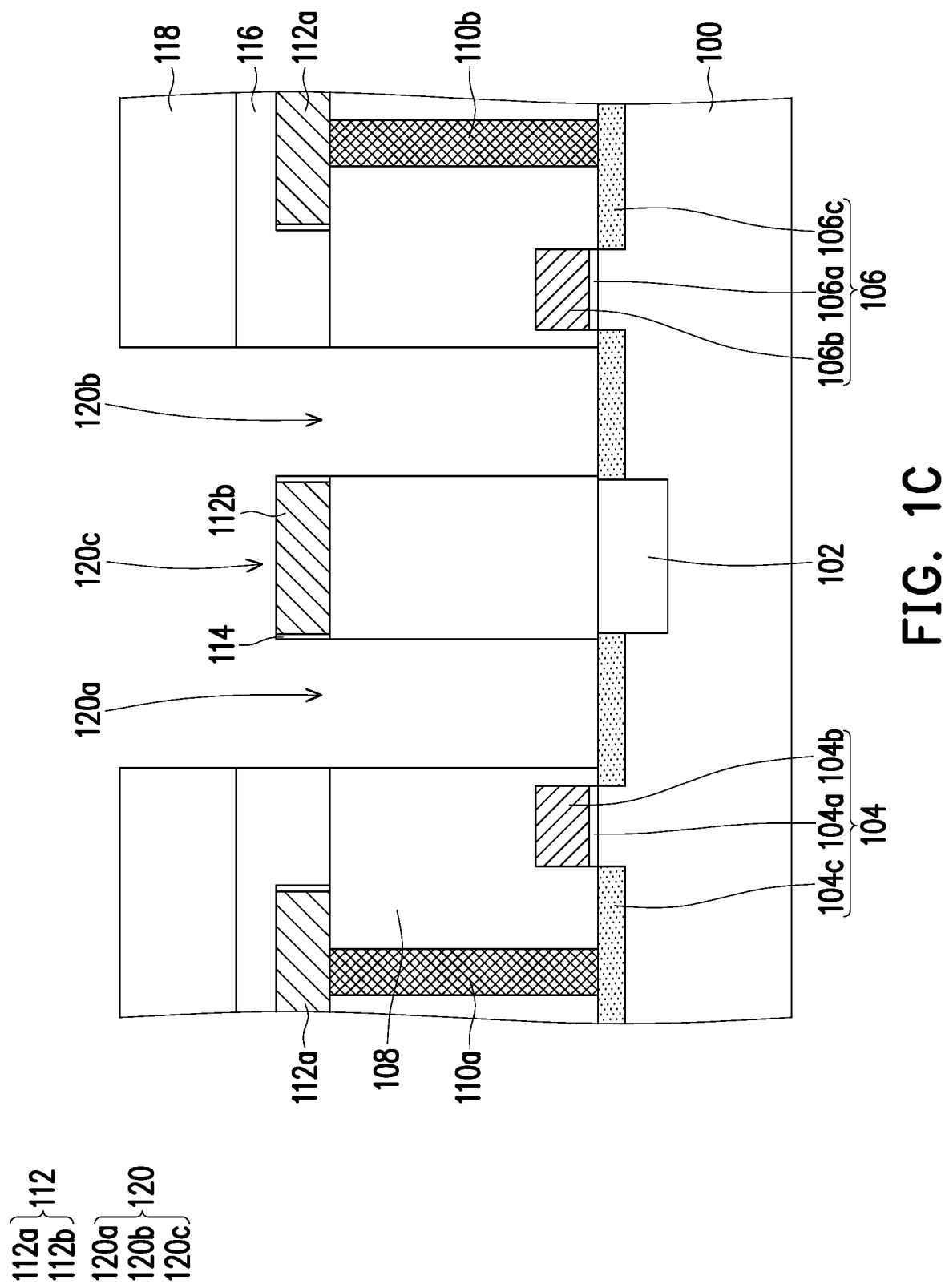

Then, referring to FIG. 1C, a dielectric layer 116 is formed on the dielectric layer 108. The dielectric layer 116 covers the conductive layer 112. The dielectric layer 116 is, for example, a silicon oxide layer. The dielectric layer 116 is also used as an inter-layer dielectric layer. Next, a patterned mask layer 118 is formed on the dielectric layer 116. The patterned mask layer 118 is, for example, a photoresist layer. The patterned mask layer 118 exposes the region between the gate 104b and the gate 106b. Thereafter, an anisotropic etching process is performed using the patterned mask layer 118 as an etching mask, so as to remove a portion of the dielectric layer 108 and a portion of the dielectric layer 116 and therefore form a trench 120. Further, during the etching process, the dummy portion 112b and the liner layer 114 on the sidewall thereof are also used as an etching mask, so that the formed trench 120 includes a first portion 120a, a second portion 120b and a third portion 120c. The first portion 120a is located in the dielectric layer 108 and the dielectric layer 116 and exposes another of the doped regions 104c of the transistor 104. The second portion 120b is located in the dielectric layer 108 and the dielectric layer 116 and exposes another of the doped regions 106c of the transistor 106. The third portion 120c is located in the dielectric layer 116 and exposes the dummy portion 112b and the liner layer 114 on the sidewall thereof.

In particular, in the present embodiment, the dummy portion 112b is disposed above the isolation structure 102. Therefore, when the above-described anisotropic etching process is performed, the dummy portion 112b can be used as an etching mask, so that the first portion 120a and the second portion 120b of the trench 120 may be formed on both sides of the dummy portion 112b to expose the doped region 104c and the doped region 106c, respectively. That is to say, the above-described anisotropic etching process is a self-aligned etching process. Therefore, the patterned mask layer 118 is merely required to expose the region between the gate 104b and the gate 106b without accurately aligning the exposed regions to the doped region 104c and the doped region 106c, thereby greatly improving the process tolerance.

Figure 1D:
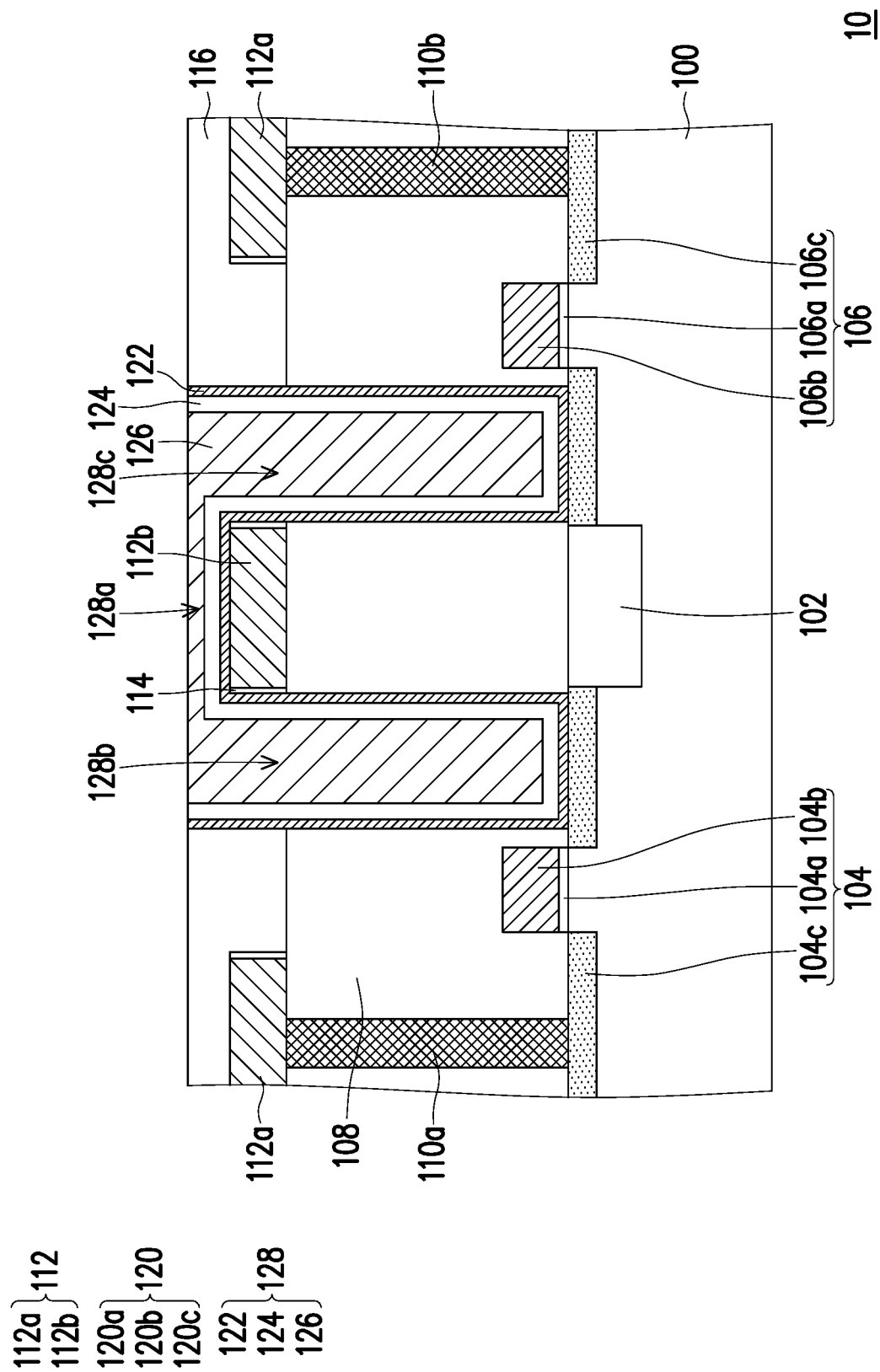

Thereafter, referring to FIG. 1D, the patterned mask layer 118 is removed. Next, a lower electrode 122, an insulating layer 124 and an upper electrode 126 are sequentially formed on the sidewall and the bottom surface of the trench 120 to form a capacitor 128. The method of forming the lower electrode 122, the insulating layer 124 and the upper electrode 126 includes: conformally forming a lower electrode material layer (for example, a titanium nitride layer) on the substrate 100; conformally forming an insulating material layer (for example, a high-k layer) on the lower electrode material layer; forming an upper electrode material layer (for example, a composite layer composed of a tungsten layer and a titanium nitride layer) on the insulating material layer to fill the trench 120; and performing a planarization process to remove a portion of the lower layer material layer, a portion of the insulating material layer and a portion of the upper electrode material layer until the dielectric layer 116 is exposed. That is, the capacitor 128 is a well-known metal-insulating layer-metal (MIM) capacitor. Other well-known methods may be used to form the capacitor 128 in other embodiments. In this way, the memory structure 10 of the present embodiment is completed. Further, a contact connected to the circuit portion 112a, a contact connected to the upper electrode 126 of the capacitor 128, and the like may be formed later, which are well-known to those skilled in the art and will not be described herein.

In the present embodiment, the memory structure 10 includes a substrate 100, an isolation structure 102, a transistor 104, a transistor 106 and a capacitor 128. The capacitor 128 is disposed between the transistor 104 and the transistor 106. The capacitor 128 is composed of a lower electrode 122, an insulating layer 124 and an upper electrode 126, and the insulating layer 124 is located between the lower electrode 122 and the upper electrode 126. In addition, the capacitor 128 includes a body portion 128a, an extension portion 128b and an extension portion 128c, and each of the body portion 128a, the extension portion 128b and the extension portion 128c includes a part of the lower electrode 122, a part of the insulating layer 124 and a part of the upper electrode 126. As shown in FIG. 1D, the body portion 128a is substantially horizontally extends between the gate 104b and the gate 106b, the extension portion 128b extends from the body portion 128a to the source/drain region (doped region 104c) of the transistor 104 and is connected to the source/drain region of the transistor 104 through the lower electrode 122, and the extension portion 128c extends from the body portion 128a to the source/drain region (doped region 106c) of the transistor 106 and is connected to the source/drain region of the transistor 106 through the lower electrode 122. In this way, the capacitor 128 can be electrically connected to the transistor 104 and the transistor 106 at the same time. In addition, each of the extension portion 128b and the extension portion 128c has a substantially uniform width.

In the memory structure 10, the body portion 128a of the capacitor 128 is disposed over the dummy portion 112b of the conductive layer 112, and the extension portion 126b and the extension portion 126c are disposed between the circuit portion 112a and the dummy portion 112b of the conductive layer 112 and penetrate down through the dielectric layer 108 to connect to the transistors 104 and 106, so that the coupling ratio between the lower electrode 122 and the upper electrode 126 can be increased by adjusting the thickness of the dielectric layer 108 without additionally increasing the layout area, thereby improving the performance of the memory structure.

Further, in the present embodiment, the body portion 128a of the capacitor 128 is disposed above the conductive layer 112, and the extension portion 128b and the extension portion 128c are disposed between the circuit portion 112a and the dummy portion 112b of the conductive layer 112. However, the present invention is not limited thereto. In other embodiments, the body portion 128a of the capacitor 128 may also be disposed above an upper conductive layer, and the extension portion 128b and the extension portion 128c are disposed between the circuit portion and the dummy portion of the upper conductive layer to further increase the coupling ratio between the lower electrode 122 and upper electrode 126.

Further, in the present embodiment, the conductive layer 112 includes one dummy portion 112b, but the present invention is not limited thereto. In other embodiments, the conductive layer 112 can include a plurality of dummy portions 112b.

Figure 2:
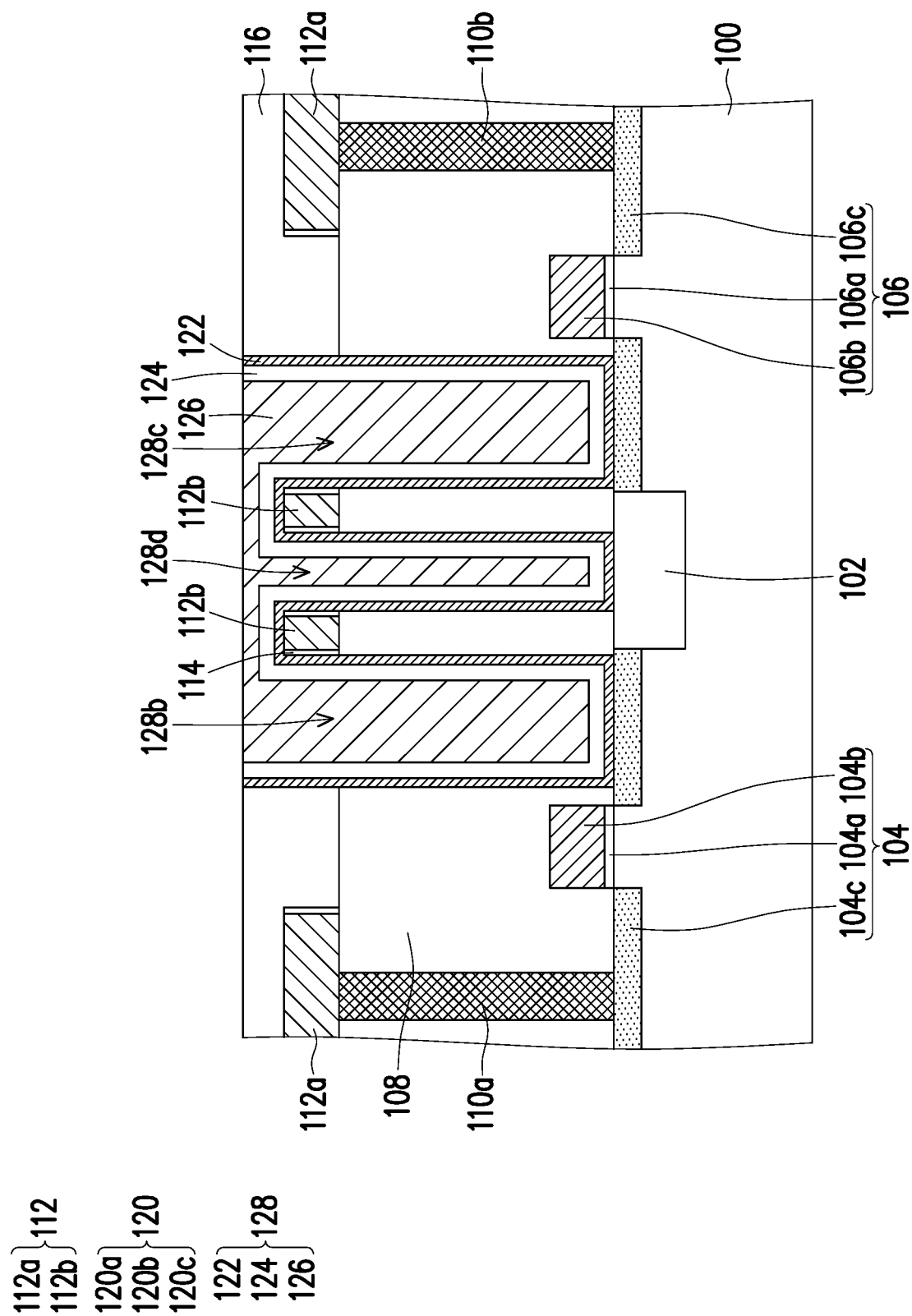
FIG. 2 is a schematic cross-sectional view of a memory structure in accordance with another embodiment of the present invention.

FIG. 2 is a schematic cross-sectional view of a memory structure in accordance with another embodiment of the present invention. In the present embodiment, the same elements as those in FIG. 1D will be denoted by the same reference numerals and will not be described again.

Referring to FIG. 2, the difference between the memory structure 20 and the memory structure 10 lies in that, in the memory structure 20, the conductive layer 112 includes two dummy portions 112b, and the capacitor 128 further includes an extension portion 128d. The extension portion 128d is disposed between the two dummy portions 112b and extends from the body portion 128a to the isolation structure 102. The extension portion 128d includes a part of the lower electrode 122, a part of the insulating layer 124 and a part of the upper electrode 126. As a result, the capacitor 128 can have a higher coupling ratio, thereby further improving the performance of the memory structure.

In addition, in other embodiments, the conductive layer 112 may also include three or more dummy portions 112b depending on actual needs to further increase the coupling ratio of the capacitor.

Figure 3A:
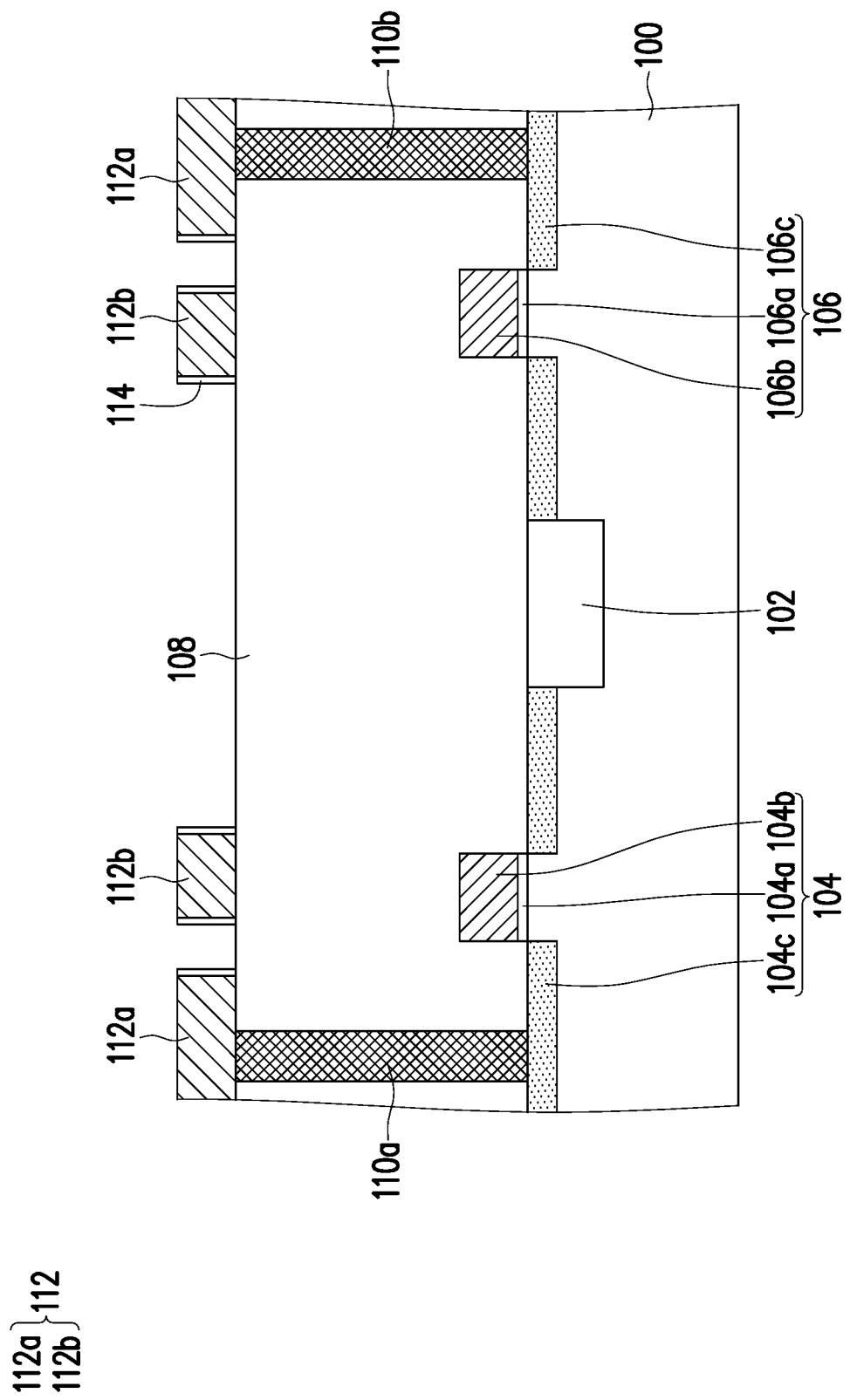
FIGS. 3A to 3C are schematic cross-sectional views showing a manufacturing process of a memory structure in accordance with another embodiment of the present invention.
Figure 3B:
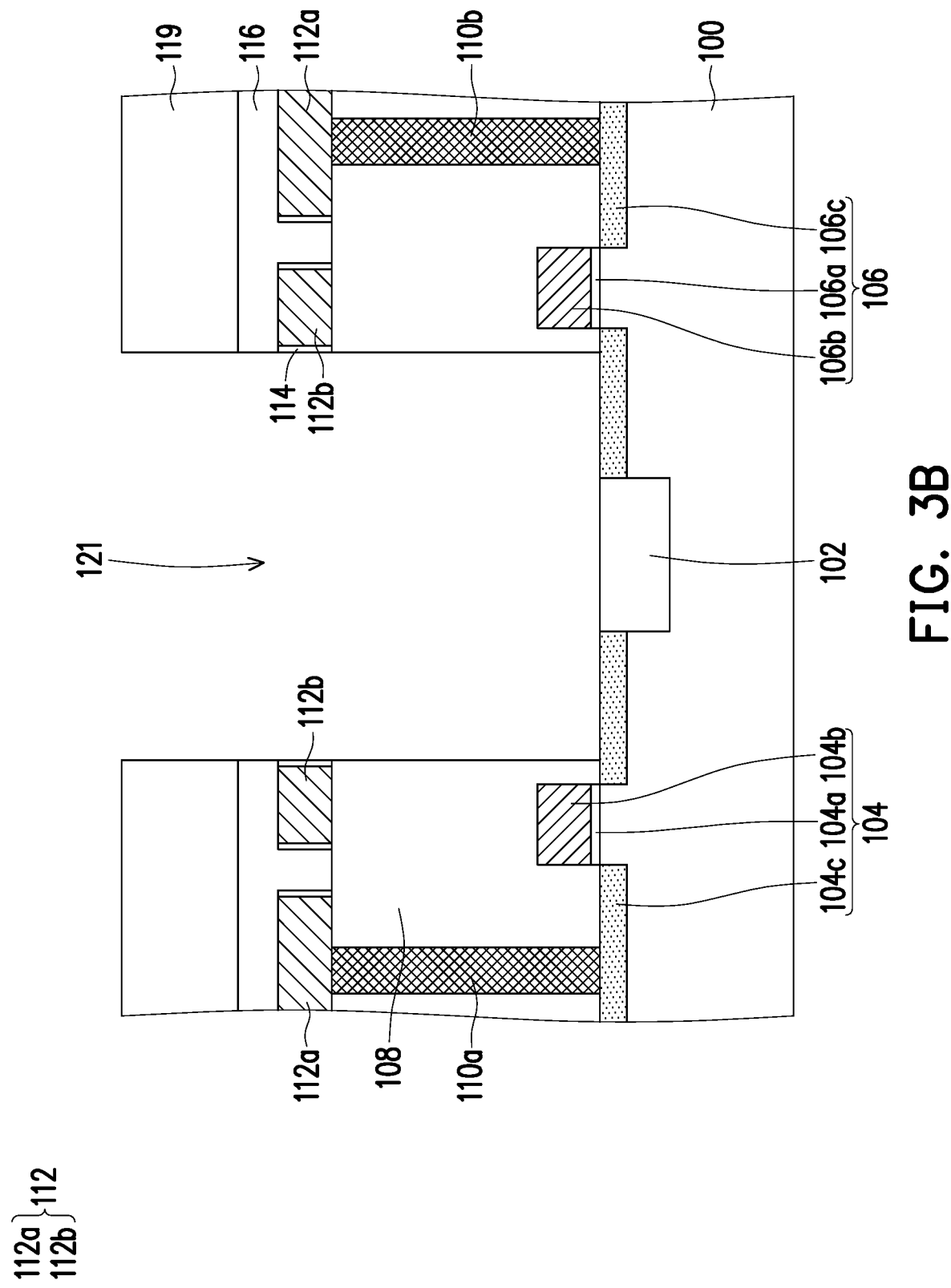
Figure 3C:
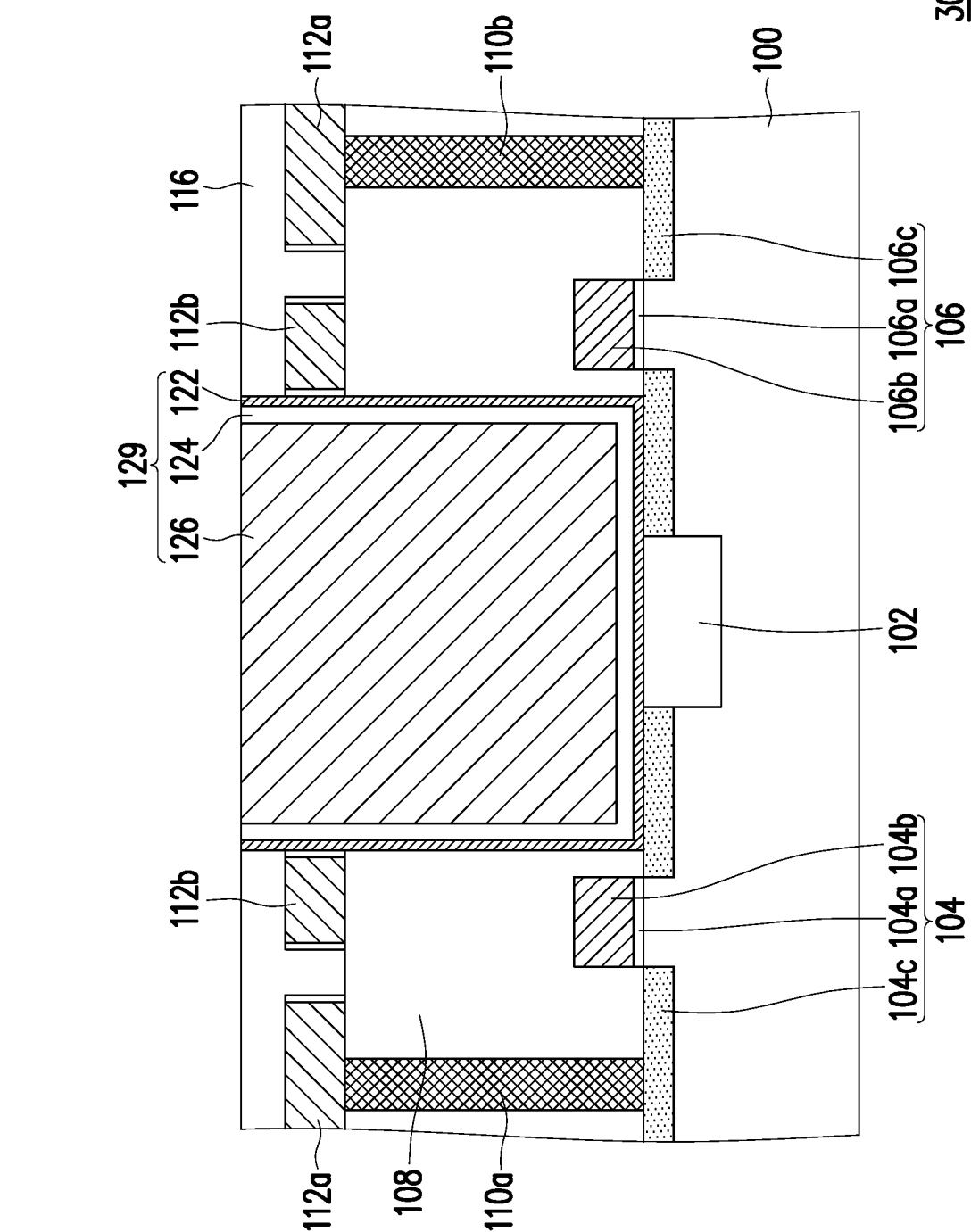

FIGS. 3A to 3C are schematic cross-sectional views showing a manufacturing process of a memory structure in accordance with another embodiment of the present invention. In the present embodiment, the same elements as those in FIGS. 1A to 1D will be denoted by the same reference numerals and will not be described again.

Referring to FIG. 3A, after forming the contact 110a and the contact 110b in FIG. 1B, a conductive layer 112 is formed. In the present embodiment, the conductive layer 112 includes a circuit portion 112a and two dummy portions 112b. The circuit portion 112a is connected to the contact 110a and the contact 110b and therefore electrically connected to the transistor 104 and the transistor 106; that is, the circuit portion 112a is a portion of the interconnection structure. The two dummy portions 112b are located above the transistors 104 and the transistor 106, respectively, and are electrically separated from the circuit portion 112a and other devices. Next, a liner layer 114 is optionally formed on the sidewall of the conductive layer 112.

Then, referring to FIG. 3B, a dielectric layer 116 is formed on the dielectric layer 108. The dielectric layer 116 covers the conductive layer 112. The dielectric layer 116 is, for example, a silicon oxide layer. The dielectric layer 116 is also used as an inter-layer dielectric layer. Next, a patterned mask layer 119 is formed on the dielectric layer 116. The patterned mask layer 119 is, for example, a photoresist layer. The patterned mask layer 119 exposes the region between the gate 104b and the gate 106b. Thereafter, the patterned mask layer 119 is used as an etching mask, and an anisotropic etching process is performed to remove a portion of the dielectric layer 108 and a portion of the dielectric layer 116 and therefore form a trench 121. The trench 121 exposes the doped region 104c of the transistor 104, the doped region 106c of the transistor 106 and the isolation structure 102.

In particular, in the present embodiment, the dummy portions 112b are disposed above the transistor 104 and the transistor 106. Therefore, when the above-described anisotropic etching process is performed, the dummy portions 112b can be used as an etching mask to expose a region including doped region 104c and the doped region 106c on both sides of the isolation structure 102. That is to say, the above anisotropic etching process is a self-aligned etching process. Therefore, the patterned mask layer 119 is merely required to expose the region between the gate 104b and the gate 106b without accurately aligning the exposed regions to the doped region 104c and the doped region 106c, thereby greatly improving the process tolerance. Further, in the present embodiment, the positions of the dummy portions 112b are not particularly limited, as long as the gate 104b and the gate 106b are not exposed by the formed trench 121 when the dummy portions 112b are used as an etching mask.

Next, referring to FIG. 3C, a lower electrode 122, an insulating layer 124 and an upper electrode 126 are sequentially formed on the sidewall and the bottom surface of the trench 121 to form a capacitor 129. The method of forming the lower electrode 122, the insulating layer 124 and the upper electrode 126 includes: conformally forming a lower electrode material layer (for example, a titanium nitride layer) on the substrate 100; conformally forming an insulating material layer (for example, a high-k layer) on the lower electrode material layer; forming an upper electrode material layer (for example, a composite layer composed of a tungsten layer and a titanium nitride layer) on the insulating material layer to fill the trench 121; and performing a planarization process remove a portion of the lower layer material layer, a portion of the insulating material layer and a portion of the upper electrode material layer until the dielectric layer 116 is exposed. That is, the capacitor 129 is the well-known MIM capacitor. Other well-known methods may be used to form the capacitor 129 in other embodiments. In this way, the memory structure 30 of the present embodiment is completed. Further, a contact connected to the circuit portion 112a, a contact connected to the upper electrode 126 of the capacitor 129, and the like may be formed later, which are well-known to those skilled in the art and will not be described herein.

In the present embodiment, the memory structure 30 includes a substrate 100, an isolation structure 102, a transistor 104, a transistor 106 and a capacitor 129. The capacitor 129 is disposed between the transistor 104 and the transistor 106. The capacitor 129 is composed of a lower electrode 122, an insulating layer 124 and an upper electrode 126, and the insulating layer 124 is located between the lower electrode 122 and the upper electrode 126.

In the memory structure 30, the capacitor 129 is disposed between the dummy portions 112b of the conductive layer 112 and penetrates down through the dielectric layer 108 and is connected to the source/drain regions of the transistor 104 and 106 through the lower electrode 122. In this way, the capacitor 129 can be electrically connected to the transistor 104 and the transistor 106 at the same time. Therefore, the coupling ratio between the lower electrode 122 and the upper electrode 126 can be increased by adjusting the thickness of the dielectric layer 108 without additionally increasing the layout area, thereby improving the performance of the memory structure.

Further, in the present embodiment, the capacitor 129 is located between the dummy portions 112b of the conductive layer 112, but the present invention is not limited thereto. In other embodiments, the capacitor 129 may also be disposed between the dummy portions of an upper conductive layer to further increase the coupling ratio between the lower electrode 122 and the upper electrode 126.

In addition, in the present embodiment, the entire capacitor 129 is located between the dummy portions 112b of the conductive layer 112, but the present invention is not limited thereto. In other embodiments, the coupling ratio between the lower electrode 122 and the upper electrode 126 of the capacitor 129 may be further increased by adjusting the region exposed by the patterned mask layer 119.

Figure 4:
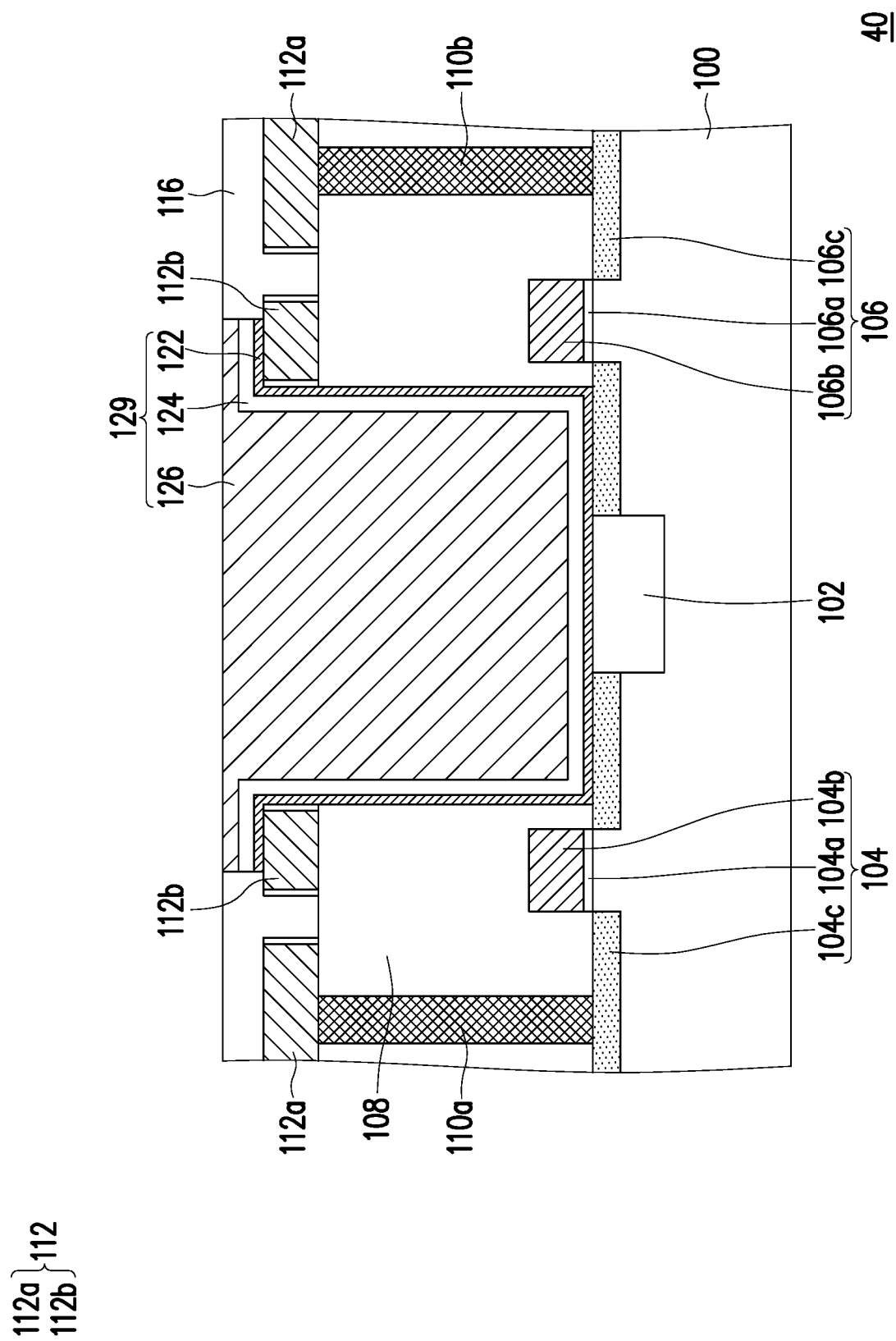
FIG. 4 is a cross-sectional view of a memory structure in accordance with another embodiment of the present invention.

FIG. 4 is a cross-sectional view of a memory structure in accordance with another embodiment of the present invention.

In the present embodiment, the patterned mask layer 119 not only exposes the region including the doped region 104c, the doped region 106c and the isolation structure 102, but also exposes a region including a portion of the top surface of each of the dummy portions 112b. Therefore, when the anisotropic etching process described in FIG. 3B is performed, the formed trench 121 can expose a portion of the top surface of each of the dummy portions 112b. As such, as shown in FIG. 4, in the memory structure 40, the capacitor 129 can cover a portion of the top surface of each of the dummy portions 112b, thereby further increasing the coupling ratio between the lower electrode 122 and the upper electrode 126.

Further, in the present embodiment, the capacitor 129 may cover a portion of the top surface of each of the dummy portions 112b, but the present invention is not limited thereto. In other embodiments, the capacitor 129 may also cover the entire top surface of each of the dummy portions 112b to further increase the coupling ratio between the lower electrode 122 and the upper electrode 126.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure, comprising:
    a first transistor and a second transistor, wherein each of the first and second transistors comprises a gate disposed on a substrate and two source/drain regions disposed in the substrate;
    an isolation structure, disposed in the substrate between the first transistor and the second transistor;
    a conductive layer, disposed above the first transistor and the second transistor, and comprising a circuit portion, a first dummy portion and a second dummy portion, wherein the circuit portion is electrically connected to the first transistor and the second transistor, the first dummy portion is located above the first transistor, and the second dummy portion is located above the second transistor; and
    a capacitor, disposed on the substrate and having a part located between the first dummy portion and the second dummy portion.

2. The memory structure of claim 1, wherein the first transistor is one of an N-type metal oxide semiconductor transistor and a P-type metal oxide semiconductor transistor, and the second transistor is another one of the N-type metal oxide semiconductor transistor and the P-type metal oxide semiconductor transistor.

3. The memory structure of claim 1, wherein the capacitor exposes at least one portion of a top surface of the first dummy portion and at least one portion of a top surface of the second dummy portion.

4. The memory structure of claim 1, wherein the capacitor is not in contact with the gate of the first transistor and the gate of the second transistor.

5. The memory structure of claim 1, further comprising a liner layer, disposed on a sidewall of the conductive layer.

6. The memory structure of claim 1, wherein the capacitor is composed of a lower electrode, an upper electrode and an insulating layer between the lower electrode and the upper electrode.

7. The memory structure of claim 6, wherein the lower electrode of the capacitor is connected to one of the source/drain regions of the first transistor, one of the source/drain regions of the second transistor and the isolation structure.

* * * * *